United States Patent
Wang et al.

(10) Patent No.: US 9,921,670 B2
(45) Date of Patent: Mar. 20, 2018

(54) ORGANIC LIGHT EMITTING DISPLAY

(71) Applicant: Samsung Display Co., Ltd., Yongin, Gyeonggi-Do (KR)

(72) Inventors: Seong-Min Wang, Yongin (KR);
Tae-Kyung Kim, Yongin (KR);
Byeong-Hoon Cho, Yongin (KR);
Mu-Gyeom Kim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 339 days.

(21) Appl. No.: 14/566,536

(22) Filed: Dec. 10, 2014

(65) Prior Publication Data

US 2015/0243712 A1 Aug. 27, 2015

(30) Foreign Application Priority Data

Feb. 26, 2014 (KR) .................. 10-2014-0022514

(51) Int. Cl.
| | | |
|---|---|---|
| *G06F 3/041* | (2006.01) | |
| *H01L 27/32* | (2006.01) | |
| *H01L 31/09* | (2006.01) | |
| *H01L 51/00* | (2006.01) | |
| *H01L 51/50* | (2006.01) | |
| *H01L 27/12* | (2006.01) | |

(52) U.S. Cl.
CPC .......... *G06F 3/041* (2013.01); *H01L 27/3227* (2013.01); *H01L 31/09* (2013.01); *H01L 51/0089* (2013.01); *H01L 27/1225* (2013.01); *H01L 51/5036* (2013.01)

(58) Field of Classification Search
CPC ..... G06F 3/041; H01L 31/09; H01L 51/0089; H01L 51/5036; H01L 27/32; H01L 51/50; H01L 51/504; H01L 2227/32
See application file for complete search history.

(56) References Cited

U.S. PATENT DOCUMENTS

| 8,451,241 B2 | 5/2013 | Kim et al. |
| 8,462,130 B2 | 6/2013 | Park et al. |
| 2009/0027358 A1 | 1/2009 | Hosono |

(Continued)

FOREIGN PATENT DOCUMENTS

| JP | 2009-032005 A | 2/2009 |
| KR | 10-0916321 B1 | 9/2009 |
| KR | 10-2011-0014478 A | 2/2011 |

OTHER PUBLICATIONS

Kawamura et al. "Observation of Neodymium Electroluminescence". Applied Physics Letters. v. 74, n. 22. pp. 3245-3247. May 31, 1999.

*Primary Examiner* — Michael Jung
*Assistant Examiner* — Mikka Liu
(74) *Attorney, Agent, or Firm* — Knobbe, Martens, Olson & Bear, LLP

(57) ABSTRACT

An organic light emitting display including a first substrate and a second substrate is described. The first substrate has a pixel divided into a light emitting area and a non-light emitting area. The first substrate has an organic light emitting diode disposed in the light emitting area. The second substrate has an infrared sensor disposed corresponding to the non-light emitting area. In the organic light emitting display, the organic light emitting diode emits visible light and infrared light, and the infrared sensor is disposed corresponding to the non-light emitting area.

8 Claims, 14 Drawing Sheets

(56) References Cited

U.S. PATENT DOCUMENTS

| | | |
|---|---|---|
| 2011/0032461 A1 | 2/2011 | Cho et al. |
| 2011/0043487 A1 | 2/2011 | Huang et al. |
| 2012/0242623 A1 | 9/2012 | Ho et al. |
| 2015/0015543 A1* | 1/2015 | Hsieh .................... G06F 3/0421 345/175 |

* cited by examiner

ORGANIC LIGHT EMITTING DISPLAY

CROSS-REFERENCE TO RELATED APPLICATIONS

This application claims priority to and the benefit of Korean Patent Application No. 10-2014-0022514, filed on Feb. 26, 2014, in the Korean Intellectual Property Office, the entire contents of which are incorporated herein by reference in their entirety.

BACKGROUND

Field

An aspect of the present embodiments relates to an organic light emitting display, and more particularly, to an organic light emitting display having a touch screen function.

Description of the Related Art

Various flat panel displays are currently used. Among these flat panel displays, an organic light emitting display displays images using organic light emitting diodes that emit light through recombination of electrons and holes. The organic light emitting display has a fast response speed and is simultaneously driven with low power consumption.

As users' demands on the convenience of inputs increase, the organic light emitting display also requires a touch screen function that enables a user's command to be inputted by selecting an instruction content displayed on a screen with a user's hand or object.

In order to implement the touch screen function, there is a method of adding a touch panel to the organic light emitting display. However, the method decreases the slimness of the organic light emitting display. Accordingly, studies on a method for implementing the touch screen function in the organic light emitting display have recently conducted.

SUMMARY

Embodiments provide an organic light emitting display having a touch screen function.

According to an aspect of the present embodiments, there is provided an organic light emitting display, including: a first substrate configured to have a pixel including a light emitting area and a non-light emitting area, the first substrate having an organic light emitting diode disposed in the light emitting area; and a second substrate configured to have an infrared sensor disposed corresponding to the non-light emitting area, wherein the organic light emitting diode emits visible light and infrared light, and the infrared sensor is disposed corresponding to the non-light emitting area.

The organic light emitting diode may include a first electrode; a first organic layer disposed on the first electrode; and a second organic layer disposed on the first organic layer. One of the first and second organic layers may emit visible light, and the other of the first and second organic layers may emit infrared light.

The organic layer emitting the infrared light may include an organic compound satisfying the following Chemical Formula 1:

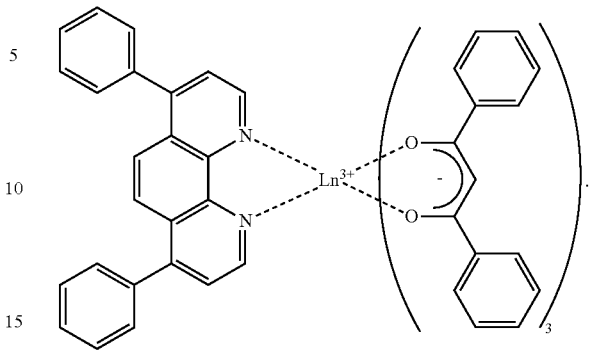

Chemical Formula 1

The Ln may be a lanthanide material. Preferably, the Ln may be one of Yb, ND and Er.

The second substrate may include a base substrate; an infrared sensor disposed on a surface of the base substrate, which faces the first substrate; a protection layer configured to cover the infrared sensor; and a light shielding pattern disposed on the protection layer.

The infrared sensor may include an infrared sensing transistor configured to sense the infrared light; and a readout transistor configured to transmit a sensing signal of the infrared sensing transistor to an outside of the infrared sensor.

A semiconductor active layer of each of the infrared sensing transistor and the readout transistor may include one of silicon germanium, amorphous silicon, poly silicon and oxide semiconductor.

The organic light emitting display may further include a light shielding layer disposed between the base substrate and the infrared sensor.

According to another aspect of the present embodiments, there is provided an organic light emitting display, including: a first substrate configured to include a plurality of pixels having a plurality of sub-pixels disposed to be spaced apart from each other; and a second substrate configured to include infrared sensors for sensing infrared light, wherein the sub-pixels have an organic light emitting diode that emits visible light and infrared light, and the infrared sensors are disposed corresponding to areas between the sub-pixels.

The organic light emitting diode may include a first electrode; an organic layer configured to include a first emitting layer disposed on the first electrode and a second emitting layer disposed on the first emitting layer; and a second electrode disposed on the organic layer. One of the first and second emitting layers may emit visible light, and the other of the first and second emitting layers may emit infrared light.

The organic layer may include a hole injection and transport layer disposed on the first electrode; a first emitting layer disposed on the hole injection and transport layer; an auxiliary layer disposed on the first emitting layer; a second emitting layer disposed on the auxiliary layer; and an electron injection and transport layer disposed on the second emitting layer. The first emitting layer may emit infrared light and the second emitting layer may emit visible light.

The organic layer may include a hole injection and transport layer disposed on the first electrode; an auxiliary layer disposed on the hole injection and transport layer; a first emitting layer disposed on the auxiliary layer; a second emitting layer disposed on the first emitting layer; and an electron injection and transport layer disposed on the second emitting layer.

The first emitting layer may emit visible light and the second emitting layer may emit infrared light. Alternatively, the first emitting layer may emit infrared light and the second emitting layer may emit visible light.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION OF THE PREFERRED EMBODIMENT

Figure 1:
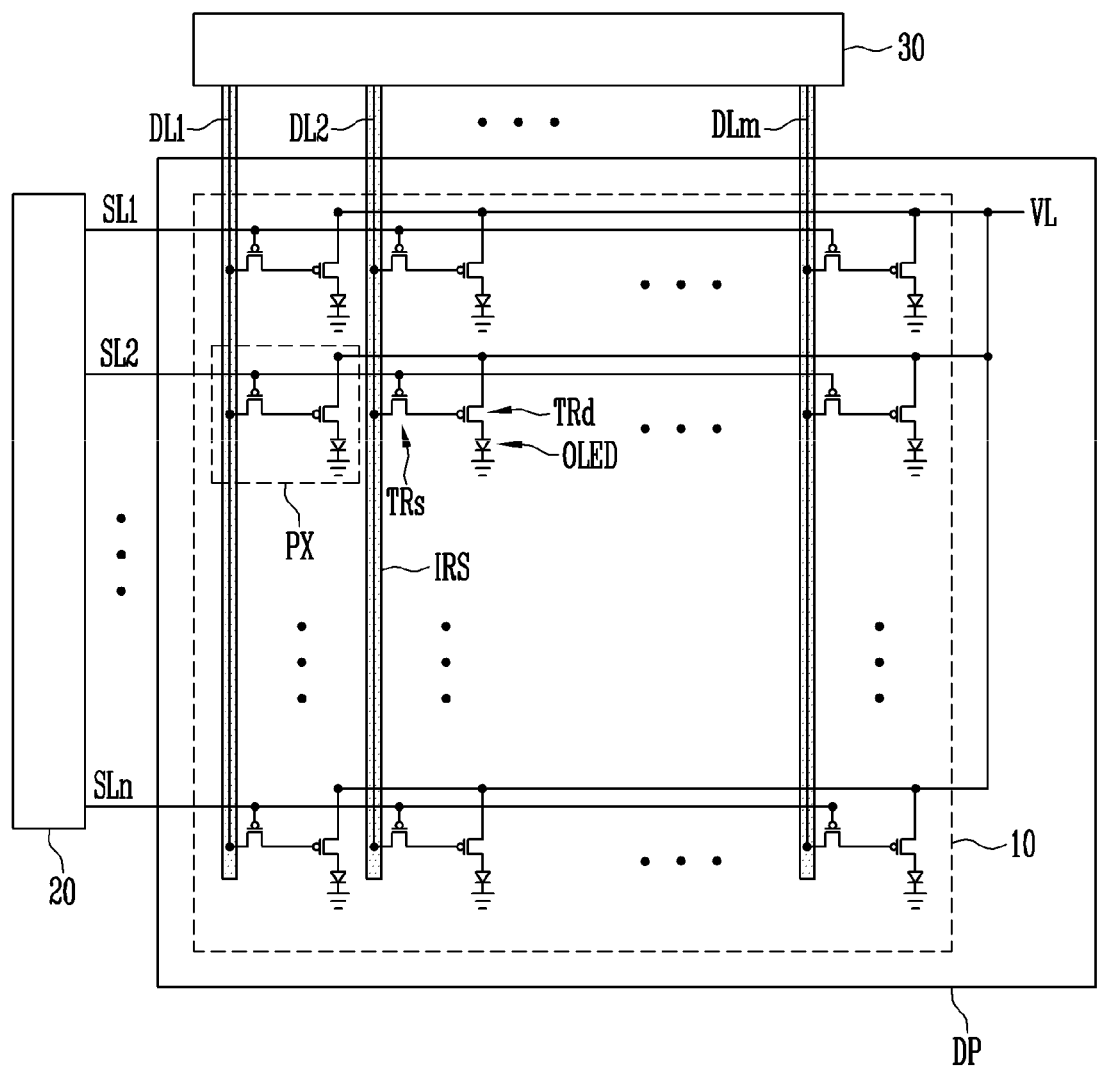
FIG. 1 is a conceptual circuit diagram illustrating an organic light emitting display according to an embodiment.

In the following detailed description, only certain example embodiments have been shown and described, simply by way of illustration. As those skilled in the art would realize, the described embodiments may be modified in various different ways, all without departing from the spirit or scope of the present embodiments. Accordingly, the drawings and description are to be regarded as illustrative in nature and not restrictive. In addition, when an element is referred to as being "on" another element, it can be directly on the another element or be indirectly on the another element with one or more intervening elements interposed therebetween. Also, when an element is referred to as being "connected to" another element, it can be directly connected to the another element or be indirectly connected to the another element with one or more intervening elements interposed therebetween. Hereinafter, like reference numerals refer to like elements. In the drawings, the thickness or size of layers are exaggerated for clarity and not necessarily drawn to scale.

FIG. 1 is a conceptual circuit diagram illustrating an organic light emitting display according to an embodiment.

Referring to FIG. 1, the organic light emitting display according to this embodiment may include a display panel DP configured to have a display unit 10 for displaying images, a scan drive 20 and a data drive 30.

Each of the scan and data drives 20 and 30 may be connected to signal lines to be electrically connected to the display unit 10 of the display panel PD. Here, the signal lines may include scan lines SL1, SL2, . . . , SLn, data lines DL1, DL2, . . . , DLm and power supply lines VL. At least one signal line may intersect the other signal lines.

More specifically, the scan drive 20 may be electrically connected to the display unit 10 by the plurality of scan lines SL1, SL2, . . . , SLn. The scan drive 20 may transmit a scan signal to the display unit 10 through the scan lines SL1, SL2, . . . , SLn. The scan lines SL1, SL2, . . . , SLn may be extended in one direction, e.g. a first direction on the display panel PD.

The data drive 30 is electrically connected to the data lines DL1, DL2, . . . , DLm. Therefore, the data drive 30 may be electrically connected to the display unit 10 by the plurality of data lines DL1, DL2, . . . , DLm. The data driver 30 may transmit a data signal to the display unit 10 through the data lines DL1, DL2, . . . , DLm.

The data lines DL1, DL2, . . . , DLm may be extended in a direction different from that of the scan lines SL1, SL2, . . . , SLn, e.g., in a second direction to intersect the scan lines SL1, SL2, . . . , SLn. The data lines DL1, DL2, . . . , DLm and the scan lines SL1, SL2, . . . , SLn may intersect each other.

The power supply lines VL may allow power to be applied to the display unit 10 therethrough. The power supply lines VL may intersect the data lines DL1, DL2, . . . , DLm and the scan lines SL1, SL2, . . . , SLn.

The display unit 10 may include a plurality of pixels PX. Each pixel PX may be electrically connected to a corresponding data line among the data lines DL1, DL2, . . . , DLm, a corresponding scan line among the scan lines SL1, SL2, . . . , SLn, and a corresponding power supply line among the power supply lines SL. Each pixel PX may includes a switching thin film transistor TRs, a driving thin film transistor TRd, a capacitor C and an organic light emitting diode OLED.

The switching thin film transistor TRs and the driving thin film transistor TRd are connected to a corresponding scan line among the scan lines SL1, SL2, . . . , SLn and a corresponding data line among the data lines DL1, DL2, . . . , DLm. Each of the switching thin film transistor TRs and the driving thin film transistor TRd includes a semiconductor active layer, a gate electrode insulated from the semiconductor active layer, and source and drain electrodes connected to the semiconductor active layer.

The display unit 10 may further include an infrared sensor IRS disposed in parallel to the data lines DL1, DL2, . . . , DLm. Here, the data lines DL1, DL2, . . . , DLm and the infrared sensor IRS may be disposed to be overlapped with each other on different substrates. If a user's had or object touches a specific position of the display panel PD, the infrared sensor IRS may sense the touched position.

Although not specifically shown in FIG. 1, the organic light emitting display may further include a plurality of thin film transistors and a plurality of capacitors in order to compensate for a threshold voltage of the driving thin film transistor.

The driving of the organic light emitting display will be briefly described. A scan signal from the scan drive 30 and a data signal from the data drive 30 are transmitted to each pixel PX along the scan lines SL1, SL2, . . . , SLn and the data lines DL1, DL2, . . . , DLm. The switching thin film transistor TRs of each pixel PX receiving the scan signal and the data signal may turn on/off the driving thin film transistor TRd. The driving thin film transistor TRd supplies, to the organic light emitting diode OLED, driving current corresponding to the data signal. The organic light emitting diode OLED receiving the driving current may generate light, using the driving current.

The capacitor C for storing the data signal during a predetermined period is connected between the drain electrode of the switching thin film transistor TRs and the gate electrode of the driving thin film transistor TRd. The data signal stored in the capacitor C may apply a constant data signal to the gate electrode of the driving thin film transistor TRd even in a state in which the switching thin film transistor TRs is turned off.

If a user's hand or object touches a specific position of the display panel DP, the infrared sensor IRS generates a sensing signal of the touched position. The sensing signal may be transmitted to a separate driver IC (not shown).

Hereinafter, the structure of the organic light emitting display will be described in detail with reference to FIGS. 2 to 5. In the organic light emitting display, it will be assumed that the direction in which the switching thin film transistor TRs, the driving thin film transistor TRd and the organic light emitting diode OLED are disposed on a substrate referred to as an "upper portion".

Figure 2:
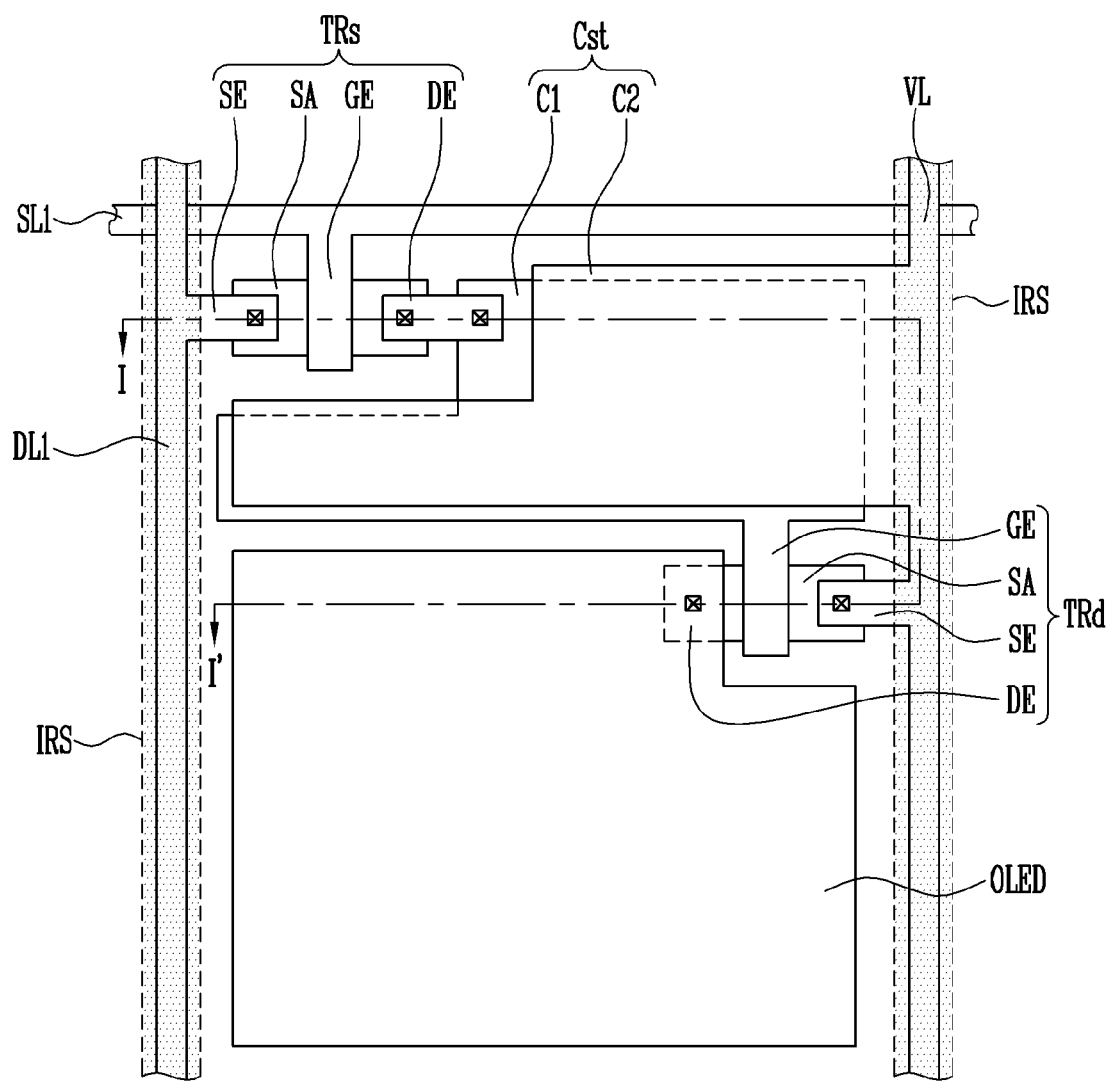
FIG. 2 is plan view illustrating one pixel of the organic light emitting display shown in FIG. 1.
Figure 3:
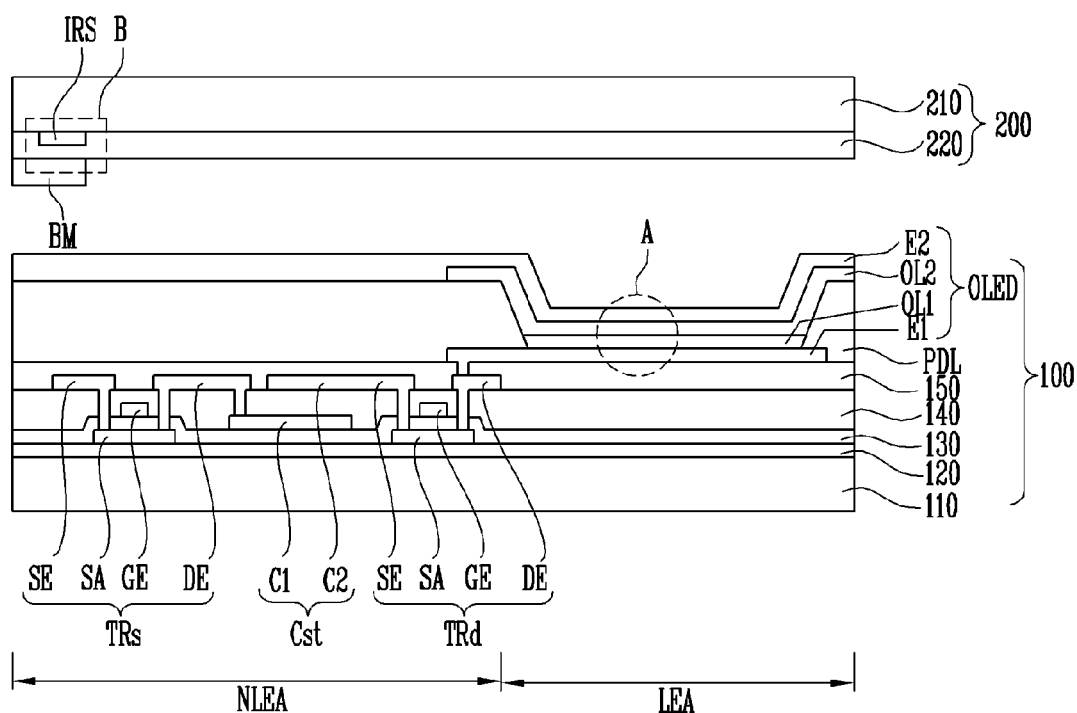
FIG. 3 is a sectional view taken along line I-I' of FIG. 2.
Figure 4:
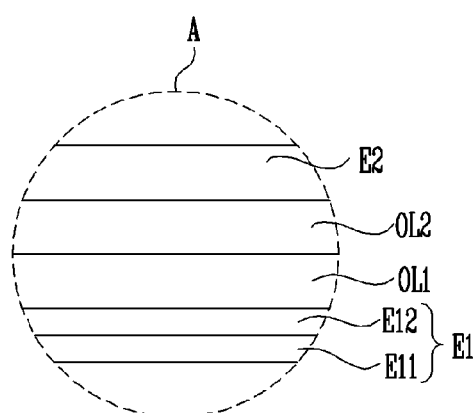
FIG. 4 is an enlarged view of area A of FIG. 3.
Figure 5:
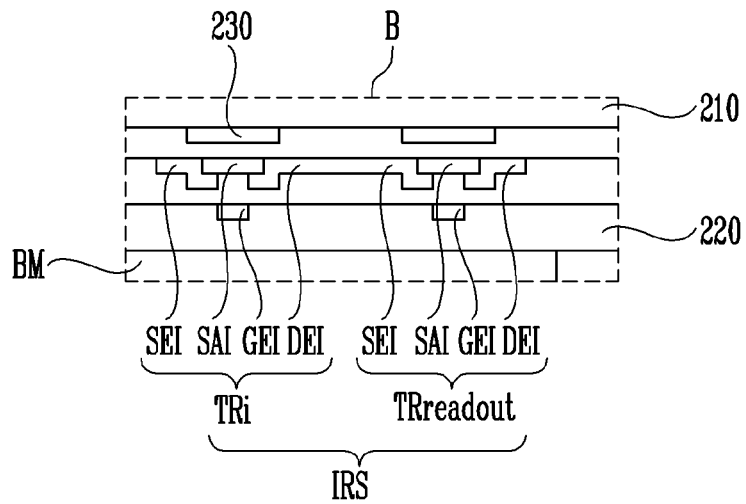
FIG. 5 is an enlarged view of area B of FIG. 3.

FIG. 2 is plan view illustrating one pixel of the organic light emitting display shown in FIG. 1. FIG. 3 is a sectional view taken along line I-I' of FIG. 2. FIG. 4 is an enlarged view of area A of FIG. 3. FIG. 5 is an enlarged view of area B of FIG. 3.

Referring to FIGS. 2 to 5, the pixel of the organic light emitting display includes a first substrate 100 divided into a light emitting area LEA and a non-light emitting area NLEA, and a second substrate 200 opposite to the first substrate 100.

A switching thin film transistor TRs, a driving thin film transistor TRd, and a capacitor Cst electrically connected to the switching thin film transistor TRs and the driving thin film transistor TRd may be disposed in the non-light emitting area NLEA of the first substrate 100. In addition, an organic light emitting diode OLED electrically connected to the driving thin film transistor TRd may be included in the light emitting area LEA of the substrate 100.

The switching thin film transistor TRs and the driving thin film transistor TRd may connected to the scan line SL1, the data line DL1 and the power supply line VL, shown in FIG. 1.

The switching thin film transistor TRs and the driving thin film transistor TRd may be disposed on a first base substrate 110. The first base substrate 110 may be a rigid type base substrate or a flexible type base substrate. The rigid type base substrate may be one of a glass base substrate, a quartz base substrate, a glass ceramic base substrate and a crystalline glass base substrate. The flexible type base substrate may be one of a film base substrate including a polymer organic material and a plastic base substrate. The material applied to the first base substrate 110 preferably has resistance (or heat resistance) against high processing temperature in a fabricating process.

Each of the switching thin film transistor TRs and the driving thin film transistor TRd may include a semiconductor active layer SA disposed on the first base substrate 110, a gate electrode GE insulated from the semiconductor active layer SA, and source and drain electrodes SE and DE connected to the semiconductor active layer SA.

The semiconductor active layer SA may include any one of amorphous silicon (a-Si), polycrystalline silicon (p-Si) and oxide semiconductor. The areas of the semiconductor active layer SA, connected to the source and drain electrodes SE and DE, may be source and drain areas doped or injected with an impurity, respectively. The area between the source and drain area may be a channel area. Here, oxide semiconductor may include at least one of Zn, In, Ga, Sn and mixture thereof. For example, the oxide semiconductor may include indium-gallium-zinc oxide (IGZO).

Although not shown in these figures, when the semiconductor active layer SA includes the oxide semiconductor, a light shielding layer for shielding light entering the oxide semiconductor active layer SA may be disposed on the top and bottom of the oxide semiconductor active layer SA.

A buffer layer 120 may be disposed between the semiconductor active layer SA and the first base substrate 110. The buffer layer 120 may be any one of a silicon oxide layer and a silicon nitride layer, and have a multi-layered structure including the silicon oxide layer and the silicon nitride layer. The buffer layer 120 prevents impurities from diffusing into the switching thin film transistor TRs, the driving thin film transistor TRd and the organic light emitting diode OLED. In addition, the buffer layer 120 prevents moisture and oxygen from penetrating into the switching thin film transistor TRs, the driving thin film transistor TRd and the organic light emitting diode OLED. The buffer layer 120 may planarize a surface of the first base substrate 110.

A gate insulating layer 130 for insulating the semiconductor active layer SA and the gate electrode GE from each other by covering the semiconductor active layer SA is disposed on the semiconductor active layer SA and the first base substrate 110. The gate insulating layer 130 includes at least one of silicon oxide ($SiO_2$) and silicon nitride ($SiN_x$).

The scan line SL1 and a first capacitor electrode C1, extended in one direction, are disposed on the gate insulating layer 130. A portion of the scan line SL1 may be the gate electrode GE extended to the pixel PX to be overlapped with the channel area of the semiconductor active layer SA.

An interlayer insulating layer 140 may be disposed on the gate insulating layer 130 and the gate electrode GE. Like the gate insulating layer, the interlayer insulating layer 140 may include at least one of silicon oxide and silicon nitride. The interlayer insulating layer 140 may expose portions of the source and drain areas of the semiconductor active layer SA.

The data line DL1 intersecting the scan line SL1 while being insulated from the scan line SL1, the power supply line VL, the source electrode SE and the drain electrode DE are disposed on the interlayer insulating layer 140. The source electrode SE, the drain electrode DE, a second capacitor electrode C2, the data line DL1 and the power supply line VL may include a material capable of reflecting light. For example, the source electrode SE, the drain electrode DE, the second capacitor electrode C2, the data line DL1 and the power supply line VL my include aluminum (Al) or aluminum alloy (Al-alloy).

The source and drain electrodes SE and DE may be insulated from the gate electrode GE by the interlayer insulating layer 140. The source and drain electrodes SE and DE may be connected to the source and drain areas, respectively.

It has been described in this embodiment that both the driving thin film transistor TRd and the switching thin film transistor TRs are thin film transistor of a top gate structure, the present embodiments are not limited. For example, at least one of the driving thin film transistor TRd and the switching thin film transistor TRs may be a thin film transistor of a bottom gate structure.

The capacitor Cst includes the first capacitor electrode C1 and the second capacitor electrode C2. The first capacitor electrode C1 may comprise the same material in the same layer as the scan line SL1 and the gate electrode GE. The first capacitor electrode C1 may be disposed on the gate insulating layer 130. The second capacitor electrode C2 may comprise the same material in the same layer as the data line DL1, the power supply line VL, the source electrode SE and the drain electrode DE.

A first protection layer 150 is disposed on the first base substrate 110 on which the switching thin film transistor TRs, the driving thin film transistor TRd and the capacitor Cst are disposed. The first protection layer 150 may cover the switching thin film transistor TRs, the driving thin film transistor TRd and the capacitor Cst. The first protection layer 150 may have a contact hole CH through which a portion of the drain electrode DE is exposed.

The first protection layer 150 may include at least one layer. For example, the first protection layer 150 may include an inorganic protection layer and an organic protection layer disposed on the inorganic protection layer. The inorganic protection layer may include at least one of silicon oxide and silicon nitride. The organic protection layer may include any one of acryl, polyimide (PI), polyamide (PA) and benzocyclobutene (BCB). The organic protection layer may be a planarization layer capable of relieving and planarizing the bending of a lower structure due to its transparency and flexibility.

The organic light emitting diode OLED may be disposed on the first protection layer 150. The organic light emitting diode OLED may include a first electrode E1 connected to the drain electrode DE, a first organic layer OL1 disposed on the first electrode E1, a second organic layer OL2 disposed on the first organic layer OL1, and a second electrode E2 disposed on the second organic layer OL2. Here, one of the first and second organic layers OL1 and OL2 may emit visible light, and the other of the first and second organic layers OL1 and OL2 may emit infrared light.

In this embodiment, the case where the first electrode E1 is a reflective anode electrode, the second electrode E2 is a transmissive cathode electrode, the first organic layer OL1 emits infrared light, and the second organic layer OL2 emits visible light will be described as an example.

The first electrode E1 may include a first conductive layer E11 disposed on the first protection layer 150, and a second conductive layer E12 disposed on the first conductive layer E11. The first conductive layer E11 may be made of a material having excellent electrical conductivity and light reflectivity. For example, the first conductive layer E11 may include at least one of Ag, Al, Pt, Ni and alloy thereof. The second conductive layer E12 may include a transparent conductive oxide having a work function higher than that of the second electrode E2. For example, the second conductive layer E12 may include any one of indium tin oxide (ITO), indium zinc oxide (IZO), aluminum zinc oxide (AZO), gallium doped zinc oxide (GZO), zinc tin oxide (ZTO), gallium tin oxide (GTO) and fluorine doped tin oxide (FTO).

A portion of the first electrode E1 may be exposed by a pixel defining layer PDL. The pixel defining layer PDL may include an organic insulative material. For example, the pixel defining layer PDL may include at least one of polystyrene, polymethylmethacrylate (PMMA), polyacrylonitrile (PAN), polyamide, polyimide, polyarylether, heterocyclic polymer, parylene, fluorine series polymer, epoxy resin, benzocyclobutene series resin, siloxane series resin and silane resin.

The first organic layer OL1 may be disposed on the first electrode E1 exposed by the pixel defining layer PDL. If power is supplied through the first and second electrodes E1 and E2, the first organic layer OL1 may generate light in a near infrared region. The first organic layer OL1 may be an organic compound including a lanthanide material as shown in the following Chemical Formula 1.

Chemical Formula 1

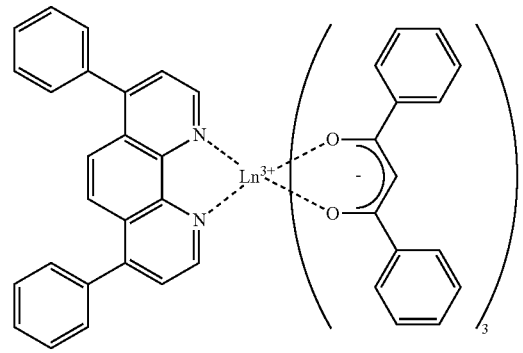

Here, the Ln may be any one of Yb, Nd and Er.

The second organic layer OL2 may be disposed on the first organic layer OL1. The second organic layer OL2 includes at least an emitting layer EML, and may generally have a multi-layered thin film structure. The color of light generated in the emitting layer may be any one of red, green, blue and white, but the present embodiments are not limited thereto. For example, the color of the light generated in the emitting layer may be any one of magenta, cyan and yellow.

The second electrode E2 is disposed on the second organic layer OL2, and may include a material having a work function lower than that of the first electrode E1. For example, the second electrode E2 may include at least one of Mo, W, Ag, Mg, Al, Pt, Pd, Au, Ni, Nd, Ir, Cr, Li, Ca and alloy thereof. The second electrode E2 may have a thickness to an extent where light can be transmitted therethrough.

A transparent conductive layer for preventing a voltage drop (IR-drop) of the second electrode E2 may be disposed on the second electrode E2. The transparent conductive layer may include the same material as the second conductive layer E12.

An infrared sensor IRS of the second substrate 200 may be disposed corresponding to the non-light emitting area of the first substrate 100. The infrared sensor IRS may be disposed not to be overlapped with the organic light emitting diode OLED. For example, the infrared sensor IRS may be disposed in parallel to any one of the data line DL1 and the scan line SL1. Preferably, the infrared sensor IRS may be disposed to be overlapped with the data line DL1. The infrared sensor IRS may include an infrared sensing transistor TRi and a readout transistor TRreadout electrically connected to the infrared sensing transistor TRi.

More specifically, first, the infrared sensing transistor TRi and the readout transistor TRreadout may be disposed below a second base substrate 210. The second base substrate 210 may include the same material as the first base substrate 110. The second base substrate 210 may be a rigid type base substrate or a flexible type base substrate.

Each of the infrared sensing transistor TRi and the readout transistor TRreadout may include a semiconductor active layer SAI disposed below the second base substrate 210, a gate electrode GEI insulated from the semiconductor active layer SAI, and source and drain electrodes SEI and DEI connected to the semiconductor active layer SAI.

The semiconductor active layer SAI may include any one of silicon germanium (SiG3), amorphous silicon (a-Si), polycrystalline silicon (p-Si) and oxide semiconductor. For example, the semiconductor active layer SAI may include the amorphous silicon. The areas of the semiconductor active layer SAI, connected to the source and drain electrodes SEI and DEI, may be source and drain areas doped or injected with an impurity, respectively. The area between the source and drain area may be a channel area.

A light shielding layer 230 for shielding light entering the oxide semiconductor active layer SAI may be disposed between the semiconductor active layer SAI and the second base substrate 210. Here, the light shielding layer 230 enables infrared light to be transmitted therethrough, but may reflect or absorb visible light.

The drain electrode DEI of the infrared sensing transistor TRi and the source electrode SEI of the readout transistor TRreadout may be electrically connected to each other. Thus, the infrared sensing transistor TRi generates an infrared sensing signal by sensing infrared light, and transmits the infrared sensing signal to the readout transistor TRreadout. The readout transistor TRreadout may transmit the infrared sensing signal to an external controller.

A second protection layer 220 may be disposed below the second base substrate 210 having the infrared sensor IRS disposed therebeneath. The second protection layer 220 may cover the infrared sensor IRS.

A light shielding pattern BM may be disposed beneath the second protection layer 220. The light shielding pattern BM is overlapped with the infrared sensor IRS, and may include a general black matrix material.

The light shielding pattern BM is formed at a portion corresponding to the boundary of the pixel, and prevents light from being transmitted through portions except the pixel.

In the organic light emitting display, visible light and infrared light can be simultaneously emitted in the organic light emitting diode OLED. Further, since the infrared sensor IRS is disposed not to be overlapped with the organic light emitting diode OLED, the opening ratio of the organic light emitting display can be improved. Thus, the organic light emitting display can prevent deterioration of display quality.

Hereinafter, other embodiments will be described with reference to FIGS. 6 to 23. In FIGS. 6 to 23, components identical to those shown in FIGS. 1 to 5 are designated by like reference numerals, and their detailed descriptions will be omitted. In FIGS. 6 to 23, different portions from those of FIGS. 1 to 5 will be mainly described to avoid redundancy.

Figure 6:
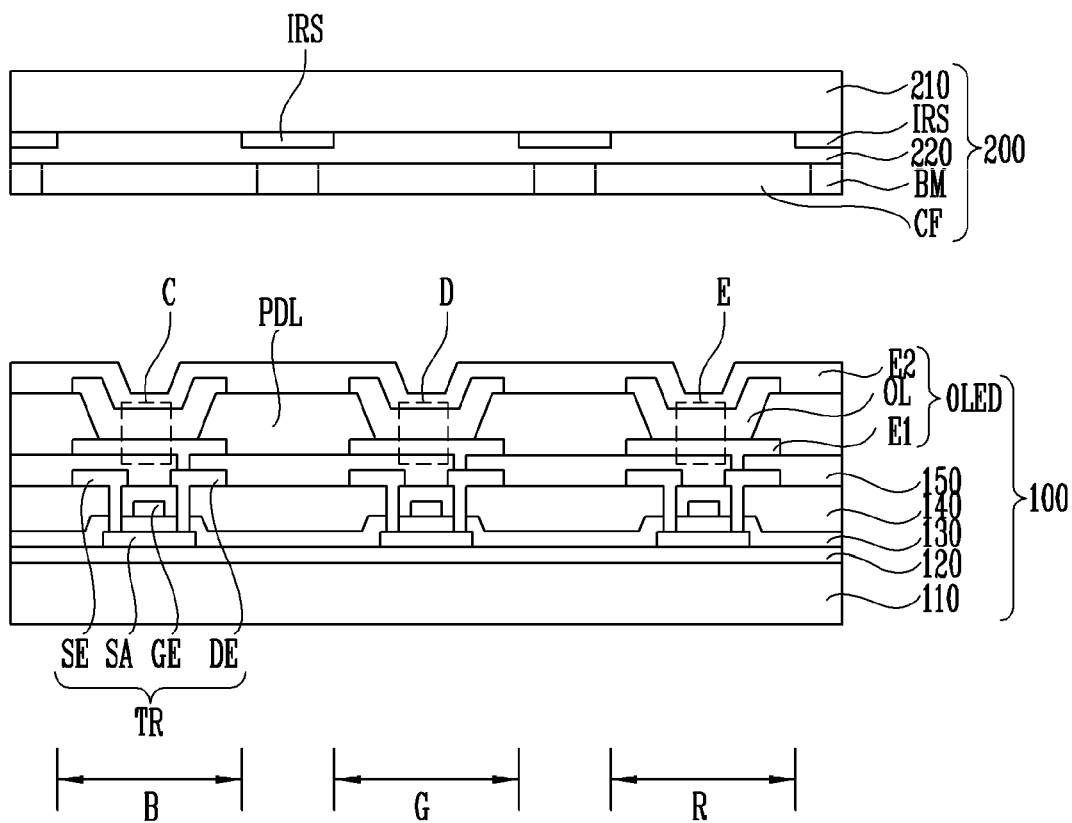
FIG. 6 is a sectional view illustrating an organic light emitting display according to another embodiment.
Figure 7:
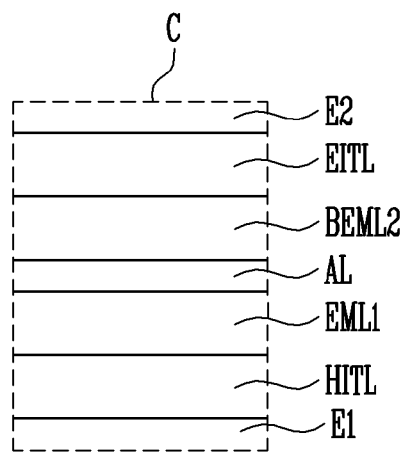
FIG. 7 is an enlarged view of area C of FIG. 6.
Figure 8:
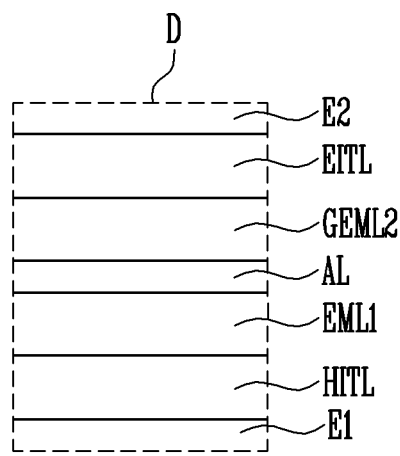
FIG. 8 is an enlarged view of area D of FIG. 6.
Figure 9:
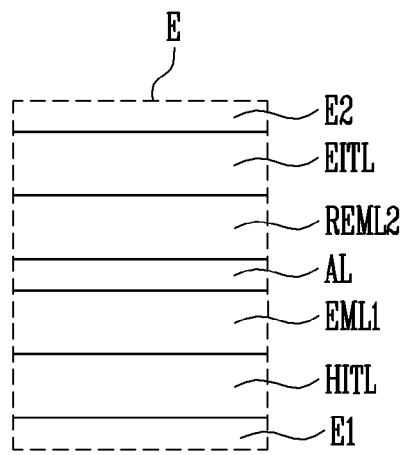
FIG. 9 is an enlarged view of area E of FIG. 6.
Figure 10:
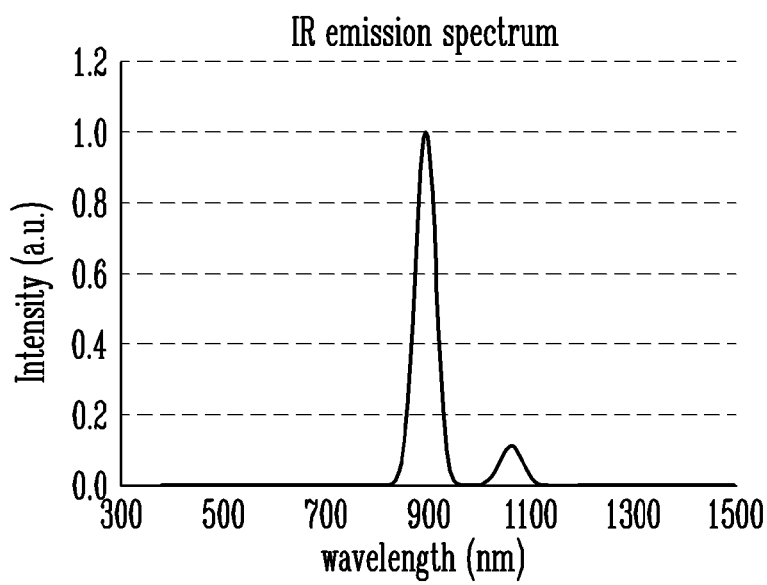
FIGS. 10 to 12 are graphs illustrating spectra of infrared light emitted from sub-pixels shown in FIGS. 7 to 9.
Figure 11:
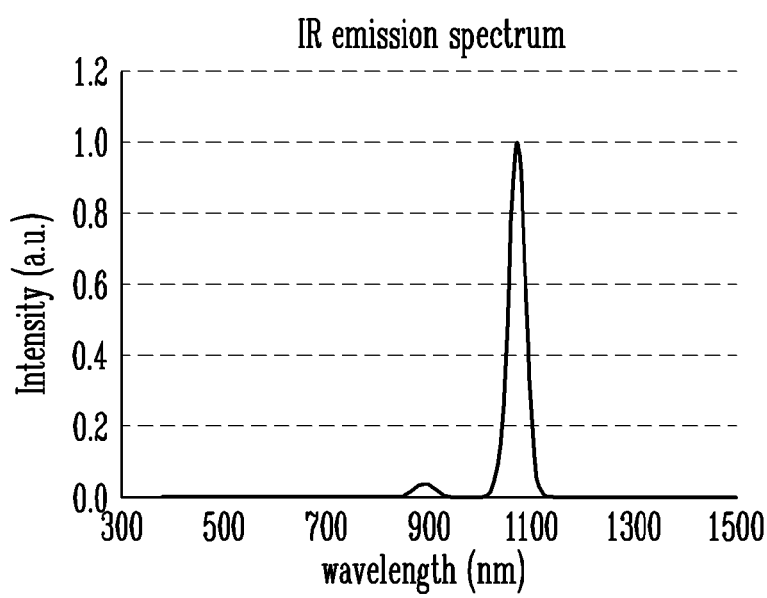
Figure 12:
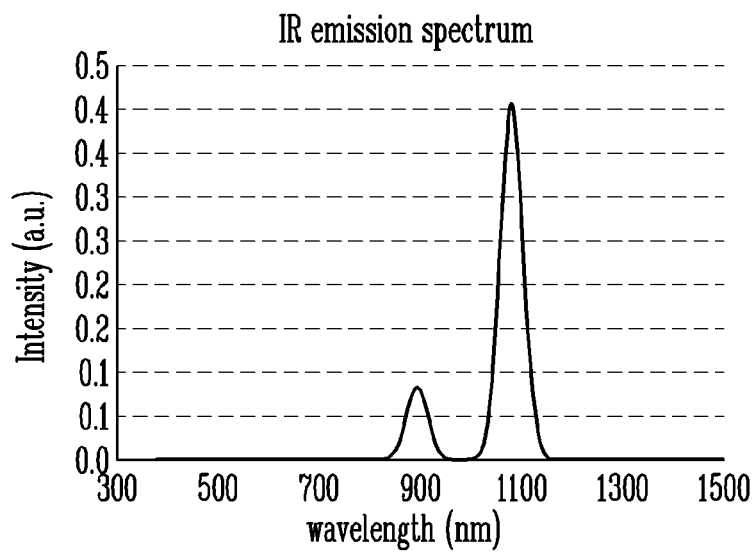

FIG. 6 is a sectional view illustrating an organic light emitting display according to another embodiment. FIG. 7 is an enlarged view of area C of FIG. 6. FIG. 8 is an enlarged view of area D of FIG. 6. FIG. 9 is an enlarged view of area E of FIG. 6. FIGS. 10 to 12 are graphs illustrating spectra of infrared light emitted from sub-pixels shown in FIGS. 7 to 9.

Referring to FIGS. 6 to 12, the organic light emitting display may include a first substrate 100 configured to have a plurality of sub-pixels R, G and B, and a second substrate 200 configured to have a plurality of infrared sensors IRS.

The sub-pixels R, G and B of the first substrate 100 emit light of different colors from each other.

Hereinafter, the first substrate 100 will be described in detail by taking, as an example, the case where the sub-pixels R, G and B have first to third sub-pixels R, G and B which emit light of different colors from each other.

Each of the sub-pixels R, G and B of the first substrate 100 may include at least one thin film transistor TR and an organic light emitting diode OLED connected to the thin film transistor TR.

The thin film transistor TR may include a semiconductor active layer SA disposed on a first base substrate 110, a gate electrode GE insulated from the semiconductor active layer SA, and source and drain electrodes SE and DE connected to the semiconductor active layer SA.

A first protection layer 150 is disposed on the thin film transistor TR. The first protection layer 150 exposes a portion of the drain electrode DE.

The organic light emitting diode OLED connected to the drain electrode DE may be disposed on the first protection layer 150. The organic light emitting diode OLED may simultaneously emit visible light and infrared light.

The organic light emitting diode OLED may include a first electrode E1 connected to the drain electrode DE, an organic layer OL disposed on the first electrode E1 exposed by a pixel defining layer PDL, and a second electrode E2 disposed on the organic layer OL.

The first electrode E1 may include a first conductive layer E11 disposed on the first protection layer 150, and a second conductive layer E12 disposed on the first conductive layer E11. The first conductive layer E11 may be made of a material having excellent electrical conductivity and light reflectivity. The second conductive layer E12 may include a transparent conductive oxide having a work function higher than that of the second electrode E2.

The organic layer OL is disposed on the first electrode E1, and may have at least a first emitting layer EML1 and a second emitting layer EML2. Here, one of the first and second emitting layers EML1 and EML2 may emit visible light, and the other of the first and second emitting layers EML1 and EML2 may emit infrared light.

Hereinafter, the organic layer OL will be described in detail by taking, as an example, the case where the first emitting layer EML1 emits infrared light and the second emitting layer EML2 emits visible light.

The organic layer OL may include a hole injection and transport layer HITL disposed on the first electrode E1, a first emitting layer EML1 disposed on the hole injection and transport layer HITL, an auxiliary layer AL disposed on the first emitting layer EML1, a second emitting layer EML2 disposed on the auxiliary layer AL, and an electron injection and transport layer EITL disposed on the second emitting layer EML2.

The hole injection and transport layer HITL may inject and transport holes supplied from the first electrode E1 into the first and second emitting layers EML1 and EML2.

If power is supplied through the first and second electrode E1 and E2, the first emitting layer EML1 may generate light in a near infrared region. The first emitting layer EML1 may be an organic compound including a lanthanide material as shown in the following Chemical Formula 2.

Chemical Formula 2

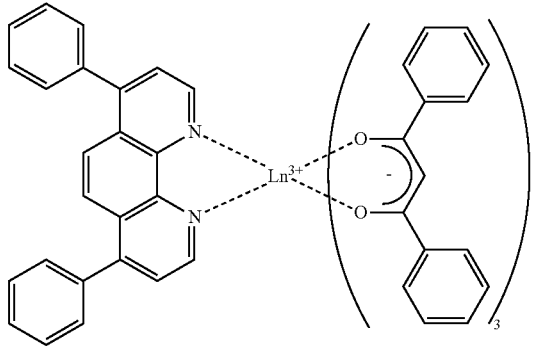

Here, the Ln may be any one of Yb, Nd and Er.

The auxiliary layer AL may allow the holes passing through the first emitting layer EML1 to be effectively transferred to the second emitting layer EML2. The auxiliary layer AL may be disposed to have a thickness changed for each of the first to third sub-pixels R, G and B, thereby adjusting a resonance distance for each color of the light emitted from the second emitting layer EML2.

The second emitting layer REML2, GEML2 or BEML2 may emit one of red light, green light, blue light and white light. For example, the second emitting layer BEML2 of the first sub-pixel B may emit blue light, the second emitting layer GEML2 of the second sub-pixel G may emit green light, and the second emitting layer REML2 of the third sub-pixel R may emit red light. The color of the light emitted in the second emitting layer REML2, GEML2 or BEML2 is not limited thereto. For example, the light emitted in the second emitting layer REML2, GEML2 or BEML2 may be any one of magenta light, cyan light and yellow light.

The electron injection and transport layer EITL may inject and transport electrons supplied from the second electrode E2 into the first emitting layer EML1 and the second emitting layer REML2, GEML2 or BEML2.

The second electrode E2 is disposed on the organic layer OL, and may include a material having a work function lower than that of the first electrode E1. For example, the second electrode E2 may include at least one of Mo, W, Ag, Mg, Al, Pt, Pd, Au, Ni, Nd, Ir, Cr, Li, Ca and alloy thereof. The second electrode E2 may have a thickness to an extent where light can be transmitted therethrough.

A transparent conductive layer (not shown) for preventing a voltage drop (IR-drop) of the second electrode E2 may be disposed on the second electrode E2. The transparent conductive layer may include the same material as the second conductive layer E12.

The first sub-pixel B may simultaneously emit the blue light emitted in the second emitting layer BEML2 and the infrared light emitted in the first emitting layer EML1. Here, the infrared light emitted in the first emitting layer EML1 may have a spectrum characteristic as shown in FIG. 10.

The second sub-pixel G may simultaneously emit the green light emitted in the second emitting layer GEML2 and the infrared light emitted in the first emitting layer EML1. Here, the infrared light emitted in the first emitting layer EML1 may have a spectrum characteristic as shown in FIG. 11.

The third sub-pixel R may simultaneously emit the red light emitted in the second emitting layer REML2 and the infrared light emitting in the first emitting layer EML1. Here, the infrared light emitted in the first emitting layer EML1 may have a spectrum characteristic as shown in FIG. 12.

The second substrate 200 may include a second base substrate 210, infrared sensors IRS disposed beneath the second base substrate 210, a second protection layer 220 configured to cover the infrared sensors IRS, light shielding patterns BM disposed beneath the second protection layer 220, and color filters CF disposed in an area between the light shielding patterns BM.

The second base substrate 210 may include the same material as the first base substrate 110. The second base substrate 210 may be a rigid type base substrate or a flexible type base substrate.

The infrared sensors IRS and the light shielding patterns BM may be disposed corresponding to areas between the sub-pixels R, G and B. Thus, the light shielding patterns BM can prevent light emitted in the sub-pixels R, G and B of the first substrate 100 from being directly incident to the infrared sensors IRS.

The color filter CF corresponding to the first sub-pixel B may be a blue color filter, and the color filter CF corresponding to the second sub-pixel G may be a green color filter. The color filter CF corresponding to the third sub-pixel R may be a red color filter. The color filter CF may be omitted when the light emitted in the organic light emitting diodes OLED is one of red light, green light and blue light.

In the organic light emitting display, visible light and infrared light can be simultaneously emitted in the organic light emitting diode OLED. Further, since the infrared sensor IRS is disposed not to be overlapped with the organic light emitting diode OLED, the opening ratio of the organic light emitting display can be improved. Thus, the organic light emitting display can prevent deterioration of display quality.

In addition, since the infrared sensors IRS are disposed between the sub-pixels R, G and B, it is possible to minimize the path of the infrared light reflected. Thus, the sensitivity of the infrared sensor IRS can be improved.

Figure 13:
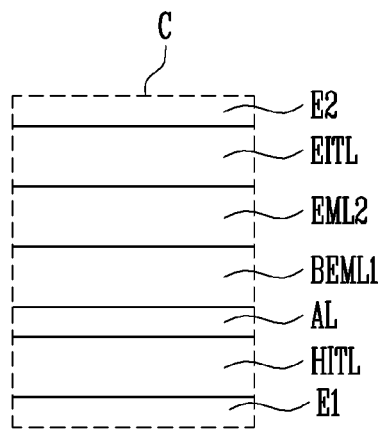
FIGS. 13 to 15 are sectional views illustrating sub-pixels of an organic light emitting display according to still another embodiment.
Figure 14:
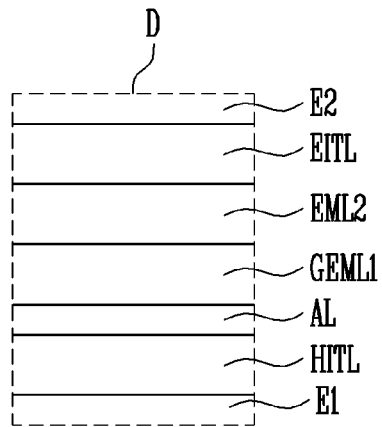
Figure 15:
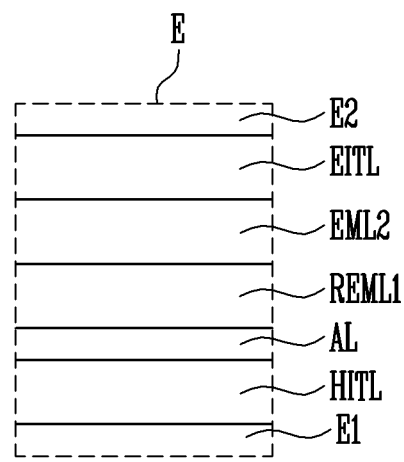
Figure 16:
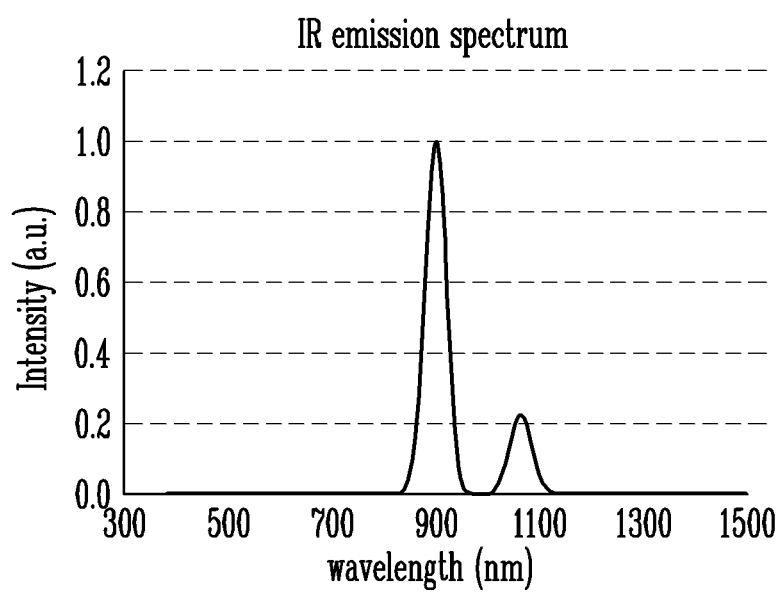
FIGS. 16 to 18 are graphs illustrating spectra of infrared light emitted from the sub-pixels shown in FIGS. 13 to 15.
Figure 17:
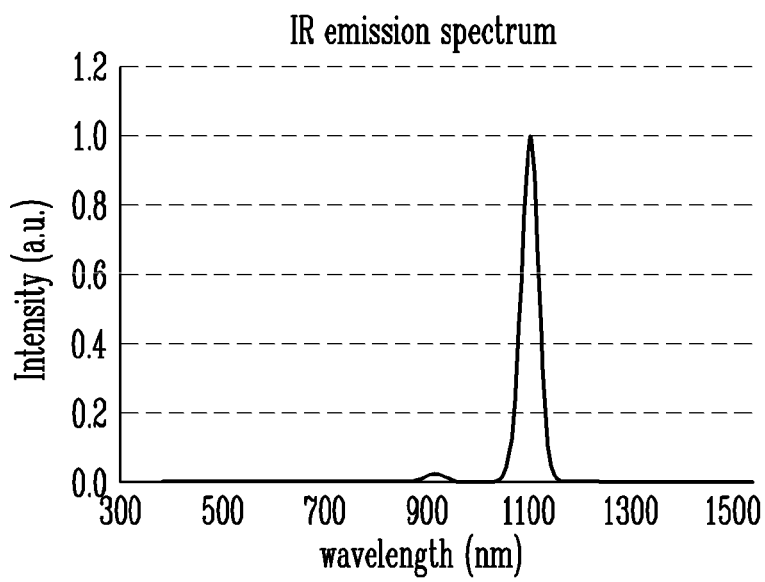
Figure 18:
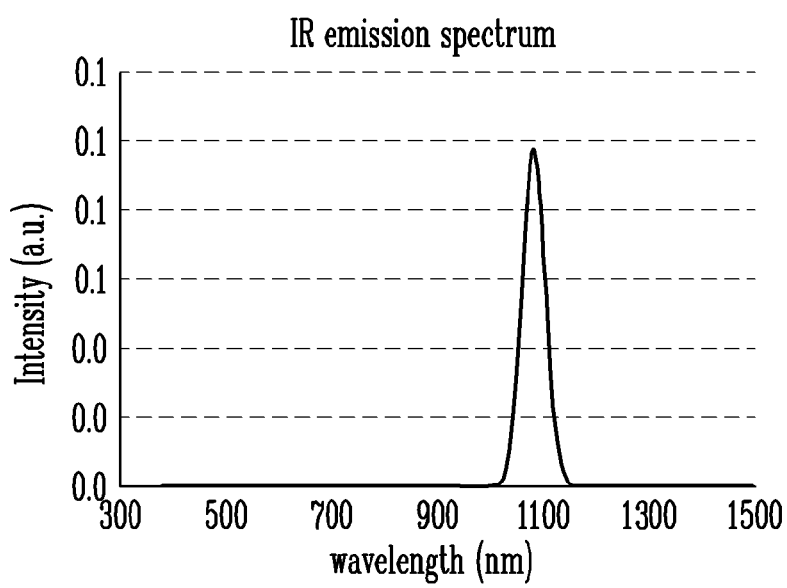

FIGS. 13 to 15 are sectional views illustrating sub-pixels of an organic light emitting display according to still another embodiment. FIG. 13 is an enlarged view of area C of FIG. 6, FIG. 14 is an enlarged view of area D of FIG. 6, and FIG. 15 is an enlarged view of area E of FIG. 6. FIGS. 16 to 18 are graphs illustrating spectra of infrared light emitted from the sub-pixels shown in FIGS. 13 to 15.

Referring to FIGS. 13 and 18, each of the sub-pixels R, G and B of the organic light emitting display may have an organic light emitting diode OLED. The organic light emitting diode OLED may include a first electrode E1, an organic layer OL disposed on the first electrode E1 exposed by a pixel defining layer PDL, and a second electrode E2 disposed on the organic layer OL.

The organic layer OL may include a hole injection and transport layer HITL disposed on the first electrode E1, an auxiliary layer AL disposed on the hole injection and transport layer HITL, a first emitting layer REML1, GEML1 or BEML1 disposed on the auxiliary layer AL, a second emitting layer EML2 disposed on the first emitting layer REML1, GEML1 or BEML1, and the electron injection and transport layer EITL disposed on the second emitting layer EML2. Here, the first emitting layer REML1, GEML1 or BEML1 may emit visible light, and the second emitting layer EML2 may emit infrared light.

The hole injection and transport layer HITL may inject and transport holes supplied from the first electrode E1 into the first emitting layer REML1, GEML1 or BEML1 and the second emitting layer EML2.

The auxiliary layer AL may allow the holes passing through the hole injection and transport layer HITL from being effectively transferred to the first emitting layer REML1, GEML1 or BEML1. The auxiliary layer AL may be disposed to have a thickness changed for each of the first to third sub-pixels R, G and B, thereby adjusting a resonance distance for each color of the light emitted from the first emitting layer REML1, GEML1 or BEML1.

The first emitting layer REML1, GEML1 or BEML1 may emit one of red light, green light, blue light and white light. For example, the first emitting layer BEML1 of the first sub-pixel B may emit blue light, the first emitting layer GEML1 of the second sub-pixel G may emit green light, and the first emitting layer REML of the third sub-pixel R may emit red light. The color of the light emitted in the first emitting layer REML1, GEML1 or BEML1 is not limited thereto. For example, the light emitted in the first emitting layer REML1, GEML1 or BEML1 may be any one of magenta light, cyan light and yellow light.

If power is supplied through the first and second electrodes E1 and E2, the second emitting layer EML2 may generate light in a near infrared region. The second emitting layer EML2 may be an organic compound including a lanthanide material as shown in the following Chemical Formula 3.

Chemical Formula 3

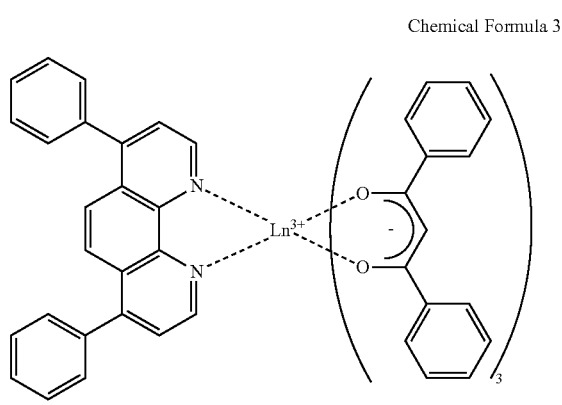

Here, the Ln may be any one of Yb, Nd and Er.

The electron injection and transport layer EITL may inject and transport electrons supplied from the second electrode E into the first emitting layer REML1, GEML1 or BEML1 and the second emitting layer EML2.

The first sub-pixel B may simultaneously emit the blue light emitted in the first emitting layer BEML1 and the infrared light emitted in the second emitting layer EML2. Here, the infrared light emitted from the second emitting layer EML2 may have a spectrum characteristic as shown in FIG. 16.

The second sub-pixel G may simultaneously emit the green light emitted in the first emitting layer GEML1 and the infrared light emitted in the second emitting layer EML2. Here, the infrared light emitted from the second emitting layer EML2 may have a spectrum characteristic as shown in FIG. 17.

The third sub-pixel R may simultaneously emit the green light emitted in the first emitting layer REML1 and the infrared light emitted in the second emitting layer EML2. Here, the infrared light emitted from the second emitting layer EML2 may have a spectrum characteristic as shown in FIG. 18.

Figure 19:
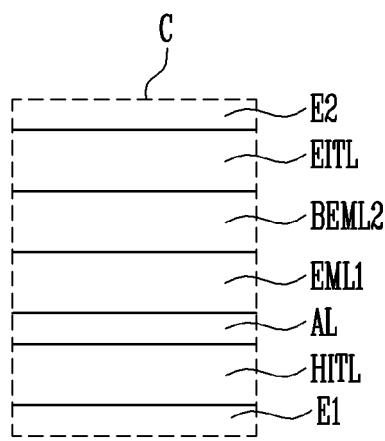
FIGS. 19 to 21 are sectional views illustrating sub-pixels of an organic light emitting display according to still another embodiment.
Figure 20:
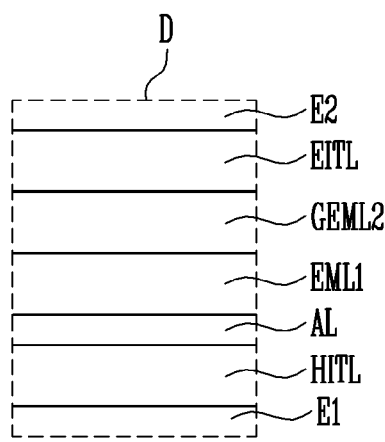
Figure 21:
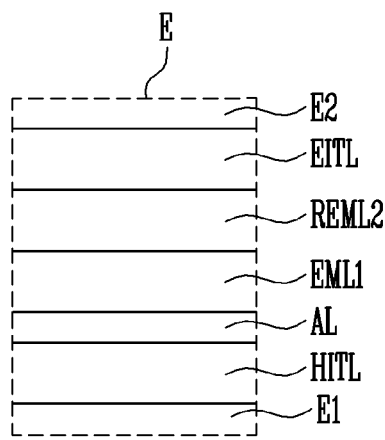
Figure 22:
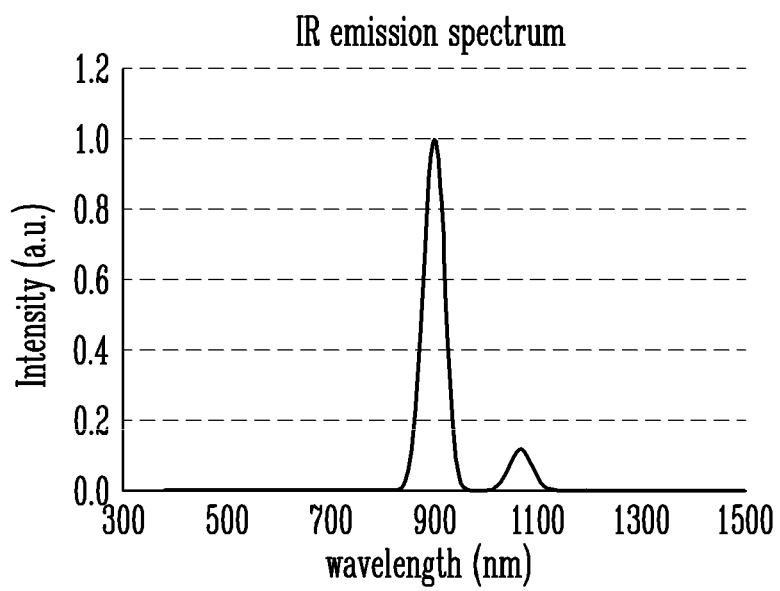
FIGS. 22 to 24 are graphs illustrating spectra of infrared light emitted from the sub-pixels shown in FIGS. 19 to 21.
Figure 23:
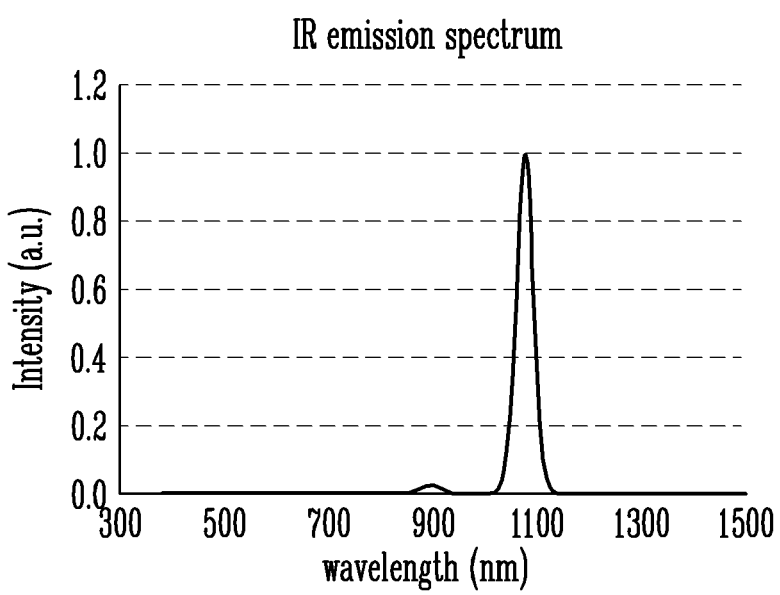
Figure 24:
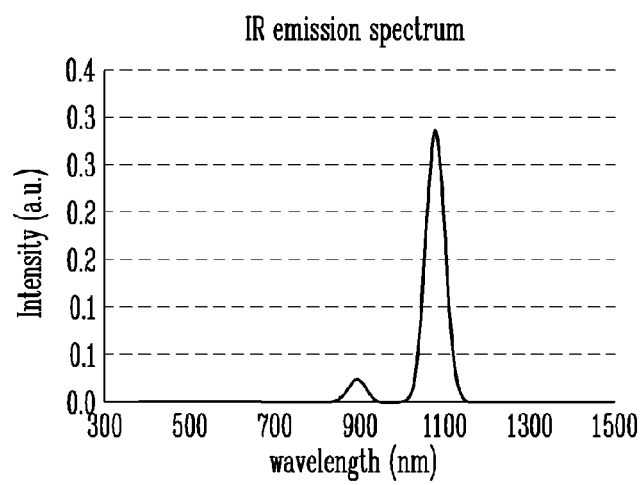

FIGS. 19 to 21 are sectional views illustrating sub-pixels of an organic light emitting display according to still another embodiment. FIG. 19 is an enlarged view of area C of FIG. 6, FIG. 20 is an enlarged view of area D of FIG. 6, and FIG. 21 is an enlarged view of area E of FIG. 6. FIGS. 22 to 24 are graphs illustrating spectra of infrared light emitted from the sub-pixels shown in FIGS. 19 to 21.

Referring to FIGS. 19 to 24, each of the sub-pixels R, G and B of the organic light emitting display may have an organic light emitting diode OLED. The organic light emitting diode OLED may include a first electrode E1, an organic layer OL disposed on the first electrode E1 exposed by a pixel defining layer PDL, and a second electrode E2 disposed on the organic layer OL.

The organic layer OL may include a hole injection and transport layer HILT disposed on the first electrode E1, an auxiliary layer AL disposed on the hole injection and transport layer HILT, a first emitting layer EML1 disposed on the auxiliary layer AL, a second emitting layer REML2, GEML2 or BEML2 disposed on the first emitting layer EML1, and an electron injection and transport layer EITL disposed on the second emitting layer REML2, GEML2 or BEML2. Here, the first emitting layer EML1 may emit infrared light, and the second emitting layer REML2, GEML2 or BEML2 may emit visible light.

The auxiliary layer AL may allow holes passing through the hole injection and transport layer HITL from being effectively transferred to the first emitting layer EML1. The auxiliary layer AL may be disposed to have a thickness changed for each of the first to third sub-pixels R, G and B, thereby adjusting a resonance distance for each color of the light emitted from the second emitting layer REML2, GEML2 or BEML2.

If power is supplied through the first and second electrodes E1 and E2, the first emitting layer EML1 may generate light in a near infrared region. The first emitting layer EML1 may be an organic compound including a lanthanide material as shown in the following Chemical Formula 4.

Chemical Formula 4

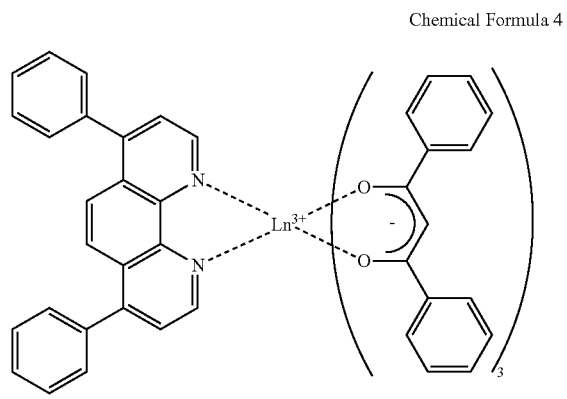

Here, the Ln may be any one of Yb, Nd and Er.

The second emitting layer REML2, GEML2 or BEML2 may emit one of red light, green light, blue light and white light. For example, the second emitting layer BEML2 of the first sub-pixel B may emit blue light, the second emitting layer GEML2 of the second sub-pixel G may emit green light, and the second emitting layer REML2 of the third sub-pixel R may emit red light. The color of the light emitted in the second emitting layer REML2, GEML2 or BEML2 is not limited thereto. For example, the light emitted in the second emitting layer REML2, GEML2 or BEML2 may be any one of magenta light, cyan light and yellow light.

The first sub-pixel B may simultaneously emit the blue light emitted in the second emitting layer BEML2 and the infrared light emitted in the first emitting layer EML1. Here, the infrared light emitted in the first emitting layer EML1 may have a spectrum characteristic as shown in FIG. 22.

The second sub-pixel G may simultaneously emit the blue light emitted in the second emitting layer GEML2 and the infrared light emitted in the first emitting layer EML1. Here, the infrared light emitted in the first emitting layer EML1 may have a spectrum characteristic as shown in FIG. 23.

The third sub-pixel R may simultaneously emit the blue light emitted in the second emitting layer REML2 and the infrared light emitted in the first emitting layer EML1. Here, the infrared light emitted in the first emitting layer EML1 may have a spectrum characteristic as shown in FIG. 24.

Figure 25:
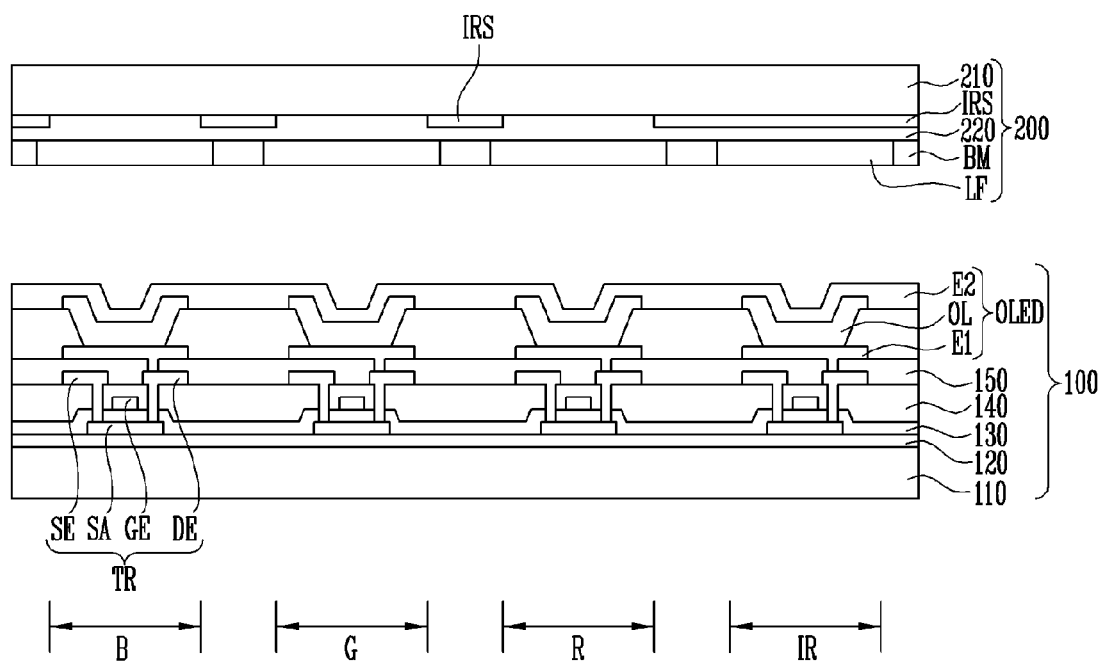
FIG. 25 is a sectional view illustrating an organic light emitting display according to still another embodiment.
Figure 26:
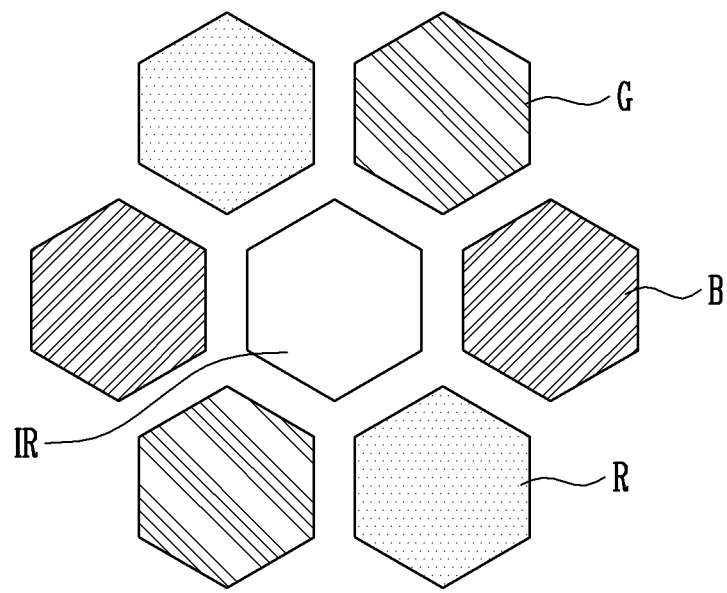
FIGS. 26 to 29 are plan views illustrating arrangements of sub-pixels shown in FIG. 25.
Figure 27:
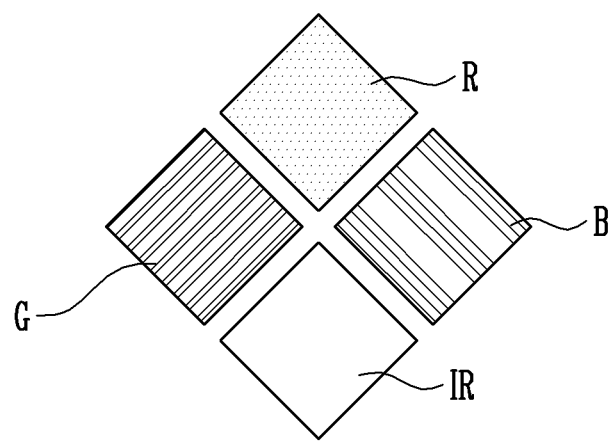

FIG. 25 is a sectional view illustrating an organic light emitting display according to still another embodiment. FIGS. 26 to 29 are plan views illustrating arrangements of sub-pixels shown in FIG. 25.

Referring to FIGS. 25 to 29, the organic light emitting display may include a first substrate 100 configured to have a plurality of pixels, e.g., first to fourth sub-pixels R, G, B and IR, and a second substrate 200 configured to have a plurality of infrared sensors IRS.

The sub-pixels R, G, B and IR emit light of different colors from each other. Each of the sub-pixels R, G, B and IR may include at least one thin film transistor TR and an organic light emitting diode OLED connected to the thin film transistor TR. Here, the organic light emitting diode OLED of each of the first to third sub-pixels R, G and B may emit visible light, e.g., one of red light, green light, blue light and white light. The organic light emitting diode OLED of the fourth sub-pixel IR may emit infrared light.

The organic light emitting diode OLED of the first to fourth sub-pixels R, G, B and IR may be connected to the thin film transistors TR of the sub-pixels R, G, B and IR, respectively. The organic light emitting diode OLED may include a first electrode E1 connected to the thin film transistor TR, an organic layer OL disposed on the first electrode E1 exposed by a pixel defining layer PDL, and a second electrode E2 disposed on the organic layer OL.

The organic layer OL of each of the first to fourth sub-pixels R, G, B and IR includes at least an emitting layer EML, and may generally have a multi-layered thin film structure. For example, the organic layer OL may include a hole injection layer HIL configured to inject holes, a hole transport layer HTL configured to have excellent hole transporting property, the hole transport layer HTL blocking movements of electrons not combined in the emitting layer EML, thereby increasing the probability of the recombination of electrons and hole, the emitting layer EML configured to emit light through recombination of holes and electrons, a hole blocking layer HBL configured to block movements of holes not combined in the emitting layer EML, an electron transport layer ETL configured to smoothly transport electrons to the emitting layer EML, and an electron injection layer EIL configured to inject electrons.

The emitting layer of each of the first to third sub-pixels R, G and B may emit any one of red light, green, light, blue light and white light. The emitting layer of the fourth sub-pixel IR may emit infrared light.

The second substrate 200 may include a second base substrate 210, infrared sensors IRS disposed beneath the second base substrate 210, a second protection layer 220 configured to cover the infrared sensors IRS, light shielding patterns BM disposed beneath the second protection layer 220, and light filters LF disposed in an area between the light shielding patterns BM.

The infrared sensors IRS and the light shielding patterns BM may be disposed corresponding to areas between the sub-pixels R, G and B. Thus, the light shielding patterns BM can prevent light emitted in the sub-pixels R, G and B of the first substrate 100 from being directly incident to the infrared sensors IRS.

The light filter LF corresponding to the first sub-pixel B may be a blue color filter, and the light filter LF corresponding to the second sub-pixel G may be a green color filter. The light filter LF corresponding to the third sub-pixel R may be a red color filter, and the light filter LF corresponding to the fourth sub-pixel IR may be an infrared filter.

The first to fourth sub-pixels R, G, B and IR may be arranged in various shapes as shown in FIGS. 26 to 29. As shown in FIGS. 26 to 29, the first to fourth sub-pixels R, G, B and IR may be arranged in a lattice shape by considering the luminance of the organic light emitting display and the amount of light emitted in the fourth sub-pixel IR.

Figure 28:
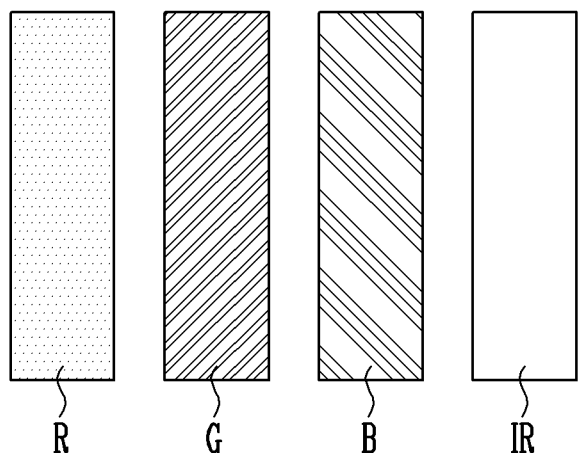

The first to fourth sub-pixels R, G, B and IR may be arranged in a stripe type as shown in FIG. 28.

Figure 29:
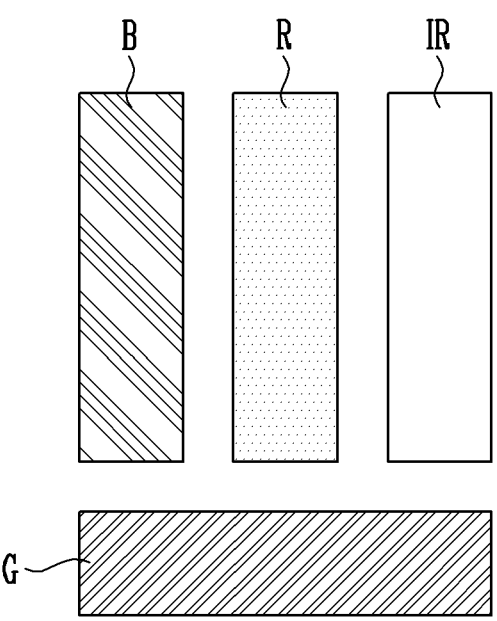

In addition, the first to fourth sub-pixels R, G, B and IR may be arranged in a pentile type as shown in FIG. 29.

As described above, the organic light emitting display can have a touch screen function. Further, in the organic light emitting display, visible light and infrared light can be simultaneously emitted in the organic light emitting diode OLED, and the infrared sensor is built in the organic light emitting display, thereby preventing a decrease in the opening ratio of the organic light emitting display. Thus, the organic light emitting display can prevent deterioration of image quality while having the touch screen function.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present embodiments as set forth in the following claims.

What is claimed is:
1. An organic light emitting display, comprising:
  a first substrate comprising a pixel including a light emitting area and a non-light emitting area, the first substrate having an organic light emitting diode disposed in the light emitting area of the pixel; and
  a second substrate comprising an infrared sensor disposed corresponding to the non-light emitting area,
    wherein the organic light emitting diode is configured to emit visible light and infrared light, and the infrared sensor is disposed corresponding to the non-light emitting area;

wherein the organic light emitting diode comprises a light emitting layer with an organic compound having the following Chemical Formula 1:

Chemical Formula 1

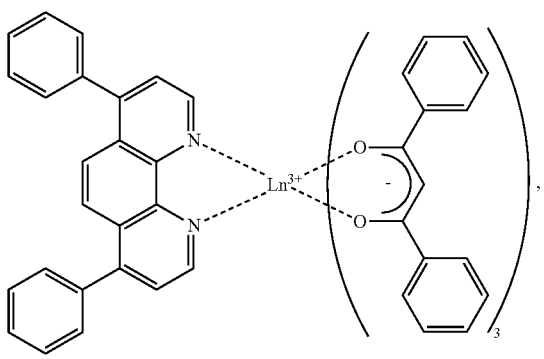

wherein Ln is a lanthanide material.

2. The organic light emitting display of claim 1, wherein the organic light emitting diode includes:
a first electrode;
a first organic layer disposed on the first electrode; and
a second organic layer disposed on the first organic layer,
wherein one of the first and second organic layers emits visible light, and the other of the first and second organic layers emits infrared light.

3. The organic light emitting display of claim 2, wherein the light emitted in the other of the first and second organic layers emitting the infrared light is near infrared light.

4. The organic light emitting display of claim 1, wherein Ln is one of Yb, Nd and Er.

5. The organic light emitting display of claim 2, wherein the second substrate includes:
a base substrate;
the infrared sensor disposed on a surface of the base substrate, which faces the first substrate;
a protection layer covering the infrared sensor; and
a light shielding pattern disposed on the protection layer.

6. The organic light emitting display of claim 5, wherein the infrared sensor includes:
an infrared sensing transistor configured to sense infrared light; and
a readout transistor configured to transmit a sensing signal of the infrared sensing transistor outside of the infrared sensor.

7. The organic light emitting display of claim 6, wherein a semiconductor active layer of each of the infrared sensing transistor and the readout transistor includes one of silicon germanium, amorphous silicon, polysilicon and an oxide semiconductor.

8. The organic light emitting display of claim 6, further comprising a light shielding layer disposed between the base substrate and the infrared sensor.

* * * * *